United States Patent [19]

Dammann et al.

[11] Patent Number: 5,029,243
[45] Date of Patent: Jul. 2, 1991

[54] DEVICE FOR WORKING A WORKPIECE USING LASER LIGHT

[75] Inventors: Hans Dammann, Tangstedt; Gert Rabe, Pinneberg, both of Fed. Rep. of Germany; Paul J. Patt, Mt. Kisco, N.Y.; Christian H. F. Velzel, Eindhoven; Klaus B. Schildbach, Waalre, both of Netherlands

[73] Assignee: U.S. Philips Corporation, New York, N.Y.

[21] Appl. No.: 407,379

[22] Filed: Sep. 14, 1989

[30] Foreign Application Priority Data

Sep. 17, 1988 [DE] Fed. Rep. of Germany ....... 3831743

[51] Int. Cl.⁵ ............................................. B23K 26/00
[52] U.S. Cl. ........................... 219/121.77; 219/121.63; 219/121.74; 219/121.75
[58] Field of Search ...................... 219/121.63, 121.64, 219/121.76, 121.77, 121.78, 121.74, 121.75

[56] References Cited

U.S. PATENT DOCUMENTS

| | | | |
|---|---|---|---|
| 4,257,673 | 3/1981 | Matthijsse | 350/96.19 |
| 4,322,600 | 3/1982 | Crahay | 219/121.76 X |
| 4,327,277 | 4/1982 | Daly | 219/121.64 |
| 4,720,621 | 1/1988 | Langen | 219/121.68 X |
| 4,748,614 | 5/1988 | Dammann et al. | 370/3 |
| 4,792,658 | 12/1988 | Langhans et al. | 219/121.63 |

OTHER PUBLICATIONS

"Synthetic digital phase gratings—Design, features, applications" by H. Dammann, Proceedings of the International Society for Optical Engineering; vol. 437, International Conference on Computer Generated Holograph, Aug. 25-26, 1983; pp. 72-78.

*Primary Examiner*—C. L. Albritton
*Attorney, Agent, or Firm*—Brian J. Wieghaus

[57] ABSTRACT

A device for working a workpiece by means of laser light includes a laser, a beamsplitter for splitting the laserbeam into at least two sub-laserbeams of substantially identical intensities, and a control unit which controls the light intensity of the laser and the movement of a workpiece support and the laserbeam relative to each other. The beamsplitter includes at least one digital-phase grating which divides the laserbeam into a plurality of sub-laserbeams to produce a pattern of laser spots onto the workpiece.

16 Claims, 2 Drawing Sheets

DEVICE FOR WORKING A WORKPIECE USING LASER LIGHT

FIELD OF THE INVENTION

The invention relates to a device for working a workpiece using laser light, comprising a laser, a splitter for specifing the laserbeam into at least two sub-laserbeams of largely identical intensity, and a control unit for controlling the intensity of the laser and the movement of a workpiece support and the laserbeam with respect to each other.

Such a device can, for example, be used for soldering or welding electronic components on printed circuits boards by means of a laser light beam. Such components together with the printed circuit board then represent the workpiece.

BACKGROUND OF THE INVENTION

The device defined in the opening paragraph is disclosed in the DE-OS No. 29 34 407. Herein the laserbeam emerging from a laser is split by means of a dual-slot diaphragm (splitter) into two sub-laserbeams which are deflected by an optical deflection unit towards the connecting elements of an electronic component. The component can be adjusted to the correct position by means of a workpiece support and additionally the sub-laserbeams can be deflected by adjusting the mirror employed in the optical deflection unit In actual practice it was found that it is almost impossible, or only at great technical cost to obtain an only approximate accurate identical distribution of the energy over the plurality of sub-laserbeams. The sub-laserbeams must however have a largely identical intensity, as otherwise under one sub-laserbeam the component or the printed circuit board is burnt, whereas the intensity of the other sub-laserbeam is in certain circumstances not sufficient to obtain a satisfactory soldered joint. Moreover laser energy is lost because of the use of a dual-slot diaphragm.

In addition, a device for the simultaneous soldering of two connecting elements of an electronic component onto a printed circuit board is disclosed in the DE-PS No. 35 39 933. Therein, a laser produces two sub-laserbeams of identical intensities, which are directed to the connecting elements of a component via an optical deflection unit. The generation of sub-laser light beams of identical intensities is however very costly.

In the prior art devices mentioned in the foregoing, the two sub-laserbeams are directed to the connecting elements via an optical deflection unit comprising movable mirrors. The mirrors are oriented before the soldering procedure. Using this device it is not possible to simultaneously solder or weld more than two connecting elements onto a printed circuit board In addition, the prior art devices are of an expensive structure, and before working the work piece costly positioning procedures of the mirrors must be effected.

SUMMARY OF THE INVENTION

It is an object of the invention to provide a device for working a workpiece with laser light which is of simple nature.

This device is characterized in that the beamsplitter includes at least one digital-phase grating which divides the laserbeam coming from the laser into a plurality of sub-laserbeams to produce a projection pattern on the workpiece.

In the device of the invention, a plurality of sub-laserbeams of largely identical intensities are produced by a digital phase-grating. Digital phase-gratings of this type are known per se from, for example, the EP-PS No. 0 002 873 or from the publication "Synthetic digital-phase gratings—Design, features, applications" by H. Dammann, Proceedings of the International Society for Optical Engineering, Volume 437, International Conference on Computer-generated Holography, August 1983, pages 25–26, 72–78 Depending on their design, digital-phase gratings can produce a different number of sub-laserbeams which produce a projection sample when projected perpendicularly onto a wall. Then only a small loss of laser energy occurs, that is to say the energy of the laser light is substantially distributed uniformly over the sub-laserbeams. The terminal points of the sub-laserbeams in the projection plane are spaced eguidistantly from each other in a direction of said plane. With the aid of a digital-phase grating it is therefore possible to solder all the connecting elements of an integrated circuit, which are eguispaced, onto a printed circuit board in one production step. The digital Phase-grating generates sub-laserbeams, whose projection pattern corresponds to the pattern of the connecting elements of the integrated circuit.

Working a workpiece usually requires different production steps Soldering components to a printed circuit board can, for example, impose different requirements thus, a first digital phase-grating can produce two sub-laserbeams for soldering of the two leads of a resistor and a second digital phase-grating can produce three sub-laserbeams for soldering of the three connecting elements of a transistor. Therefore, before a production step, a control unit moves a digital phase-grating into the path of the laserbeam, which forms the required projection pattern. Consequently, an alignment by means of mirrors is no longer required in the deflection unit.

The said publication "Synthetic digital-phase gratings-Design, features, applications" by R Dammann, Proceedings of the International Society for Optical Engineering, Volume 437, International Conference on Computer-generated Holography, August 25–26, 1983, pages 72–78 discloses how a digital phase grating can be produced. Such digital phase-gratings generates sub-laserbeams whose projection pattern is linear array of eguispaced spots. These spots have substantially the same intensity.

It should furthermore be noted that from the DE-OS No. 29 16 184 it is known to use binary digital-phase gratings in an optical lightguide device. Then, a light beam emitted by a lightguide is divided by means of a digital-phase grating into a plurality of sub-laserbeams which are radiated into further lightguides.

To provide a simple possibility for inserting a digital phase-grating into the laserbeam path, the device according to the invention is further characterized in that the beamsplitter comprises a first movable grating disc having at least two digital phase gratings, Which grating disc is insertable in the path of the laserbeam under control of the control unit.

When digital-phase gratings are used only projection patterns having spots arranged in one line can be produced. In order to generate a projection pattern having a plurality of parallel lines, the device according to the invention is characterized in that the beamsplitter comprises a second grating having at least one further digital phase grating insertable, under control of the control unit, in the path of the sub-laserbeams. When the two digital-phase gratings are shifted through 90° relative to each other, a rectangular projection pattern is obtained. When an angle differing from 90° is chosen a rhombic pattern is obtained.

The sub-laserbeams produced by a digital-phase grating are diffracted in different diffraction orders. The non-deflected sub-laserbeam emitting from the digital Phase-grating is designated as the Zero-order sub-laserbeam. The sub-laserbeams located next thereto are designated positive oz negative higher order subbeams. Thus, the sub-laserbeams immediately next to the sub-laserbeam of the zero order are the first order sub-beams.

In practice, the digital-phase gratings do not only produce the desired sub-laserbeams but also sub-laserbeams of a higher order having a significantly lower intensity. So as to eliminate these sub-laserbeams of the higher order, the device according to the invention is further characterized in that it comprises a diaphragm which can be moved into the path of the sub-laserbeams.

In order to provide a simple possibility for inserting a diaphragm, the device may be further characterized in that it comprises a rotatable circular diaphragm disc, having at least two different diaphragms for suppressing sub-laserbeams of a higher order.

To enable the working of edges of a workpiece, the device according to the invention is characterized in that an optical deflection unit is provided which comprises an array of mirrors for deflecting the sub-laserbeams to the workpiece at an oblique angle relative to the workpiece support. This enables more specifically the soldering of SMD (Surface Mounted Devices) components, whose connecting elements do not project from the base of the components, to a printed circuit board. Sub-laserbeams directed perpendicularly to the workpiece support can namely not reach the connecting elements of a SMD component.

The invention also relates to a method of soldering or welding connecting elements of electronic components by means of laser light onto a printed circuit board using the device described above. This method is characterized in that all the connecting elements of a component are simultaneously soldered or welded in one production step, that, the required binary-phase gratings and a diaphragm, respectively, are moved into the path of the laserbeam and the sub-laserbeams, respectively, by rotation of the first and/or second grating discs and the diaphragm disc respectively for generating a projection pattern corresponding to the pattern of the soldering or welding points of the connecting elements, and in, that the laser has the intensity necessary for soldering or welding only during a production step.

Using a laserbeams for soldering electronic components on printed circuit boards has the advantage that only the soldering spot is heated, by the accurately focused laserbeam, so that an overall heating of the printed circuit board and/or of the individual electronic modules and consequently a potential danger that they become overheated can be prevented.

In this method, the production step is the soldering or welding procedure. Before the actual production step the control unit in the device moves the required binary digital-phase grating and a diaphragm into the path of the laserbeams and positions the printed circuit board by means of the workpiece support. Subsequently, the intensity of the laserbeam is increased and the soldering or welding procedure starts. The intensity of the individual sub-laserbeams is then the same, that is to say soldering or welding is effected in each soldering spot at a temperature which is basically of the same value. By reducing the intensity between the production steps the energy consumption is reduced and a destruction of components or printed circuit boards is prevented. It is alternatively possible to switch the laser off between the production steps.

The invention also relates to a method for producing foil strips for foil capacitors using the device as claimed in any one of Claims 1-6. This method is characterized in that in a first production step metal is evaporated from a metal-coated foil along first lines transverse to the linear array of laserbeam spots, that in a second production step the foil is cut along second lines having the same direction as the first lines to produce foil strips having a width approximately equal to half the distance between two succeeding first lines, that before the start of a production step, the required digital-phase gratings and a diaphragm respectively are brought into the path of a laserbeam and sub-laserbeams respectively by moving the first and second gratings discs and the diaphragm disc respectively to generate a pattern of laser spots corresponding to the pattern of positions where evaporating and cutting respectively should take place and in that the laser has the required intensity for evaporating or cutting only during the corresponding production step.

In this method, the laserbeam has three different intensities. Between the production steps the intensity of the laserbeam is adjusted to a very low level, so that the foil is not damaged During the first production step the intensity of the laserbeam must he chosen such that only metal, for example aluminium, can evaporate from the foil. In the second production step the intensity of the laserbeam is at its highest. Then so much energy must be produced that the foil can be cut.

BRIEF DESCRIPTION OF THE DRAWINGS

Embodiments of the invention will now be described by way of example with reference to the accompanying drawings. Therein.

DESCRIPTION OF THE PREFERRED EMBODIMENTS

Figure 1:
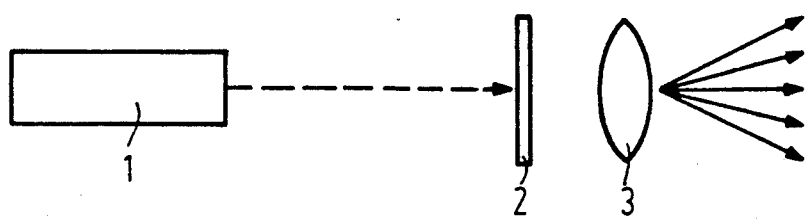
FIG. 1 shows a simplified arrangement for producing sub-laserbeams from a laserbeam by means of a digital-phase grating.

The arrangement shown in FIG. 1 for producing sub-laserbeams from a laserbeam, which forms part of a device for working a workpiece by means of laser light, comprises a laser 1, which radiates a laserbeam onto a digital-phase grating 2. The digital phase-grating 2 produces from the laserbeam sub-laserbeams by means of diffraction, which subbeams are focused by a lens 3.

Figure 2:
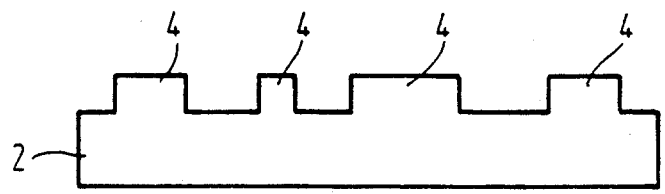
FIG. 2 is a cross-sectional view through a linear digital-phase grating.

Fig. 2 shows such a digital-phase grating in a cross-reducing sectional view. It is an optical element having a plurality of parallel strips which, in a cross-sectional view are rectangular. Producing such a digital-phase grating 2 is known from the publication "Synthetic digital-phase gratings—Design, features, applications" by H Dammann, "Proceedings of the International Society for Optical Engineering", Volume 437, International Conference on Computer-generated Holography, August 1983, pages 25-26, 72-78. This digital-phase gratings 2 with its regular structure produces from the laserbeam a given—for simple structures—odd number of sub-laserbeams. These sub-laserbeams are classified in diffraction order in accordance with their different diffractions. The undiffracted sub-laserbeam is designated as the zero subbeam. The immediately neighboring sub-laserbeams are the negative and positive first order subbeams. By way of example FIG. 1 shows a digital-phase grating of the second order, which produces five sublaserbeams and whose projection pattern is shown to the right of the arrangement of FIG. 1 and comprises five eguispaced light spots arranged on a line.

Figure 3:
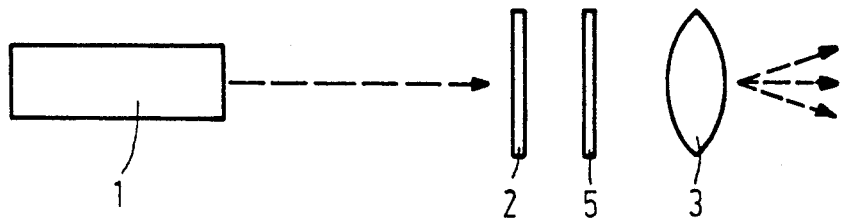
FIG. 3 shows the arrangement of Fig. 1 provided with a second digital-phase grating.

A rectangular or rhombic projection pattern can be obtained by means of a further digital-phase grating 5, which is disposed before oz behind the digital-phase grating 2. As is shown in FIG. 3, the laser 1 emits a laserbeam to the digital-phase grating 2 which produces sub-laserbeams which are passed through a further digital-phase gratings and are focused by the lens 3. In the drawing, a rectangular projection pattern having fifteen light spots is shown to the right of the arrangement. In this example the digital-phase grating 2 produces five sub-laserbeams from an incident laserbeam and the digital-phase grating 5 produces three sub-laserbeams from an incident laserbeam. If the two digital-phase gratings are shifted through 90°, that is to say the strips of the first digital-phase grating evidence are perpendicular to those of the second grating, a rectangular projection pattern is formed. The number of spots of the projection pattern is equal to the product of the numbers of sub-laserbeams. produced by the two digital-phase gratings 2 and 5 from one laserbeam It is alternatively possible to form a rhombic projection pattern when the shift between the two digital-phase gratings 2 and 5 is between 0° and 90°.

Figure 4:
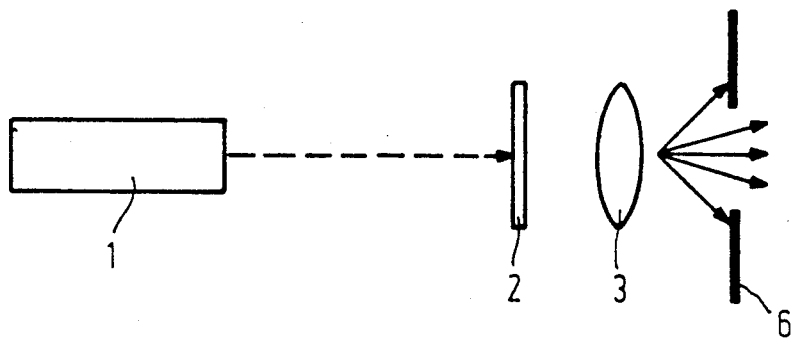
FIG. 4 shows the arrangement of FIG. 1 with a diaphragm.

The digital-phase gratings do not only produce the desired sub-laserbeams, but also sub-laserbeams of higher orders, which are unwanted. To eliminate such unwanted sub-laserbeams a diaphragm 6 can be used which is positioned behind the lens 3 as is shown in FIG. 4. The diaphragm 6 should be arranged in the focal point of the sub-laserbeams of higher order as this might destroy the diaphragm 6.

Figure 5:
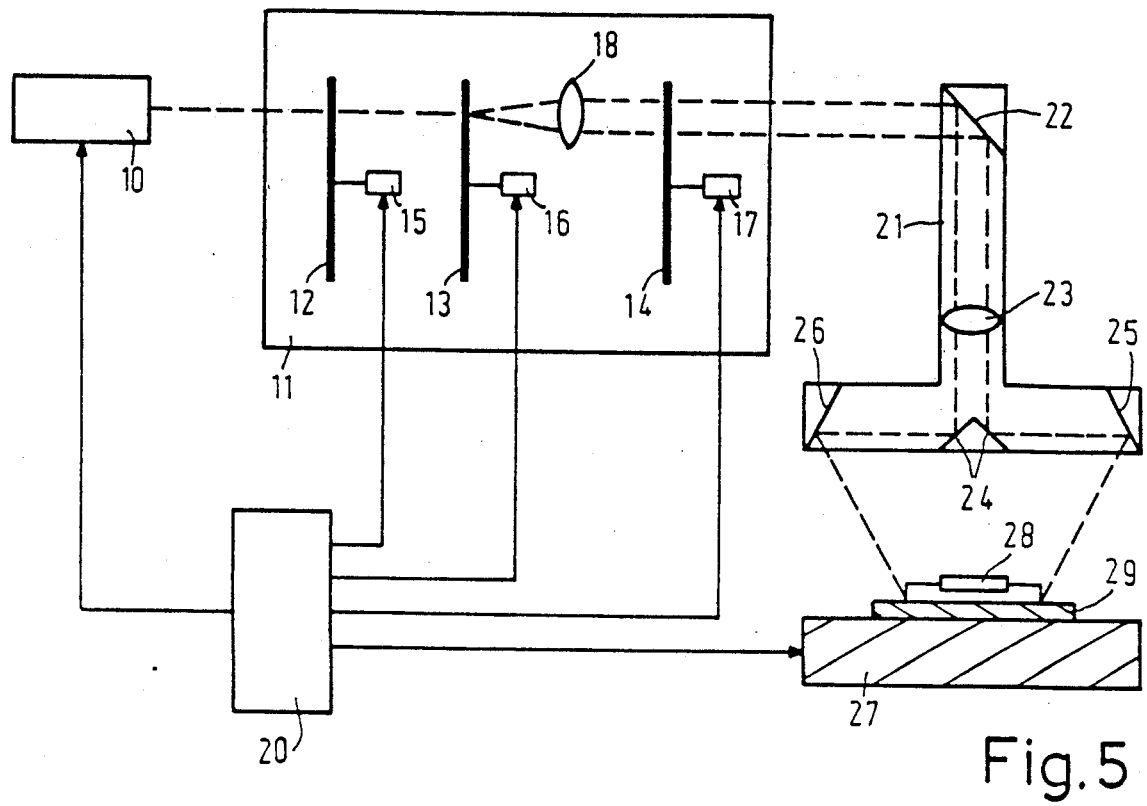
FIG. 5 is a schematically shown device for soldering connecting elements of a component to a printed circuit board and FIG. 6 is a schematically shown device for producing foil strips for film capacitors.

Hereinafter two embodiments of a device for working a workpiece with laser light will be described. A first embodiment is shown in FIG. 5 and is a device for soldering connecting elements of electronic components to a printed circuit board. This device comprises a laser 10, which radiates a laserbeam onto a beamsplitter 11, which includes grating discs 12 and 13 comprising digital-phase gratings, a lens 18 and a diaphragm disc 14. The rotatably arranged discs 12, 13 and 14 are moved by means of stepper motors 15, 16 and 17, under control of a control device 20. The control device 20 controls also the laser 10. The digital-phase gratings of the grating discs 12 and 13 produce sub-laserbeams, the sub-laser light beams of unwanted higher orders are suppressed by a diaphragm of the diaphragm disc 14.

The sub-laserbeams passing through the diaphragm of the diaphragm disc 14 are deflected by an optical deflection unit 21 to the connecting elements of a component 28, to be soldered to a printed circuit board 29. The deflection unit comprises a first mirror or prism 22 which deflects the sub-beams through 90° and directs them via a lens system 23 to two cross-wise arranged mirrors or prisms 24, which give the sub-laserbeams different directions. The lens system 23 may have a variable focal length (zoom objective), so that the spots of the projection pattern can be reduced or enlarged The mirrors 24 deflect the sub-laserbeams originating from the mirror 22 again through 90° so that the always opposite beam directions of the sub-laserbeams extends approximately parallel to the printed circuit board 29. The sub-laserbeams reflected by the mirrors 24 are deflected again by two further mirrors or prisms 25 and 26, in such a manner that they are incident onto the connecting element of the component 28 at an oblique angle with respect to the surface area of the printed circuit board 29.

The printed circuit board 2% is held by a workpiece support 27. The workpiece support 27 is controlled by the control unit 20 and has for its object to position the printed circuit board 29.

It will now be explained how, with the aid of this device, several electronic components 28· can be soldered to the printed circuit board 29. Before the actual soldering procedure (production step), the grating discs 12 and 13 and the diaphragm disc 14 in the beamsplitter 11 are moved and the workpiece support 27 is positioned. During this period the laser 10 is in the switched off state. In the beamsplitter 11 the grating discs 12 and 13 and the diaphragm disc 14 are rotated such that the required digital-phase gratings or the required diaphragm are positioned in the path of the laserbeam or the sub-laserbeams, respectively. The printed circuit board 2 with the component 28 to be soldered thereto is positioned by the workpiece support 27 such that the sub-laserbeams deflected by the optical deflection unit 21 are incident onto the connecting element of the component 28. The projection pattern of the sub-laserbeams corresponds to the pattern of the soldering spots, or the connecting elements respectively, of the component 28.

If, for example, an integrated circuit having 2×8 connecting elements is to be soldered, then before the actual soldering procedure in the beamsplitter 11, a digital-phase which produces eight sub-laserbeams from a laserbeam grating is moved by rotation of the grating disc 12 by the stepper motor 15 into the beam path, and the stepper motor 16 inserts a digital-phase grating which produces two sub-laserbeams from one laserbeam by rotation of the grating disc 13. After switch-on of the laser 10 the connecting elements of the integrated circuit are then soldered onto the printed circuit board 29 by means of the sub-laserbeams. If then in a subsequent production step a component having two connecting elements is to be soldered onto the printed circuit board 29, the control unit 20 so controls the stepper motor 15 that a digital-phase grating is inserted into the beam path, which produces two sub-laserbeams. In this case the grating disc 13 must have a hole, so that no further multiplication of the sub-laserbeams emitting from the grating disc 12 is effected.

Figure 6:
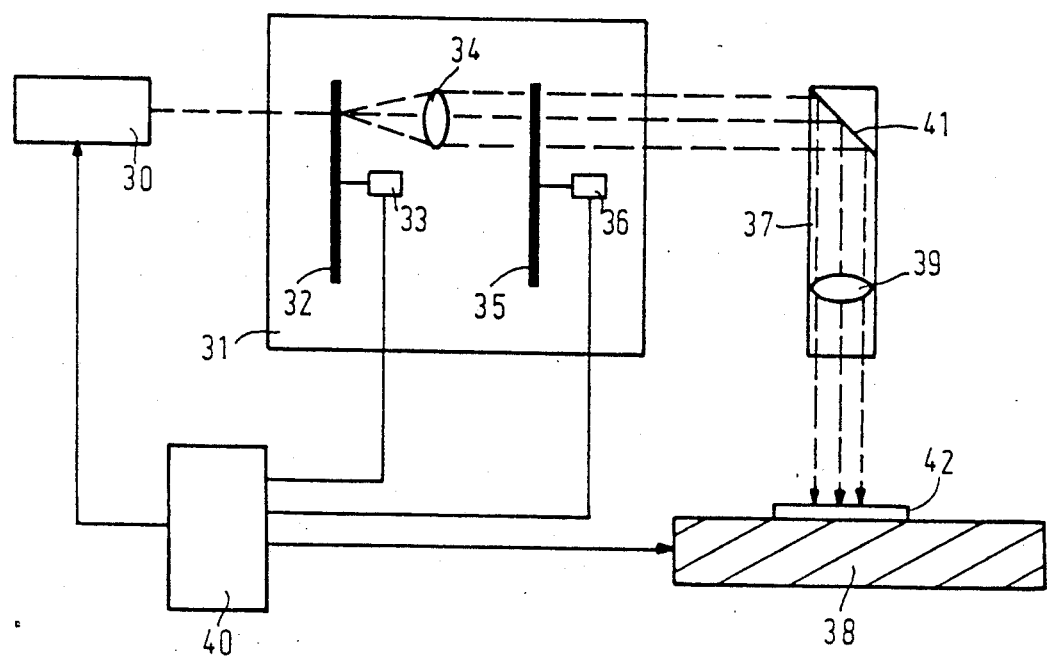

FIG. 6 shows a second embodiment of the invention. This device is used to produce foil strips for film capacitors. A laser 30 sends a beam to a beamsplitter 31. This splitter 31 includes a grating disc 32 having two digital-phase gratings which can be moved into the path of the laserbeam by means of a stepper motor 33. The sub-laserbeams produced by a digital-phase grating of the grating disc 32 pass through a lens 34. A diaphragm disc 35 which includes two diaphragms for suppressing sub-laserbeams of unwanted higher orders are arranged behind the lens 34. This diaphragm disc 35 is moved by a stepper motor 36. The sub-laserbeams supplied by the beamsplitter 31 are deflected towards a workpiece support 38 via an optical deflection unit 37. This unit includes a mirror or a prism 41, which deflects the sub-laser light beams through 90° towards a lens system 39, which passes the sub-laserbeams coming from the mirror 41 towards a foil 42.

The laser 30, the stepper motors 33 and 36 and the workpiece support 38 are controlled by a control unit 40. The foil 42 consisting, for example, of polyester with vacuum-deposited aluminium is placed on the workpiece support 38. By means of the device, foil strips for film capacitors are produced from the foil 42. In a first production step sub-laserbeams are radiated onto the foil 42, which generate a projection pattern corresponding to a line of spots. These spots are eguispaced. The workpiece support 38 is moved under the sub-laserbeams perpendicular to said line of spots, so that, when the intensity of the laserbeam is sufficiently high, first lines where aluminium has been evaporated are produced on the foil 42. In the subsequent production step a second digital-phase grating is moved into the path of the laserbeam by means of the stepper motor 30 that a second projection pattern is formed having second spots which are spaced apart by substantially half the distance between two succeeding aluminium-less lines. After switch-on of the laser the foil 42 is moved from under the sub-laserbeams, so that second lines are formed which constitute lines of separation between the foil strips. The intensity of the laser 10 has been adjusted such that the foil is cut in the locations in which the sub-laser light beams are incident The width of a foil strip cut from the foil 42 consequently corresponds to half the distance between first lines where metal was removed. In a further production step and in another device the foil strips are then folded and wound into a film capacitor and provided with leads.

I claim:

1. A device for working a workpiece using laser light, said device comprising:
    a laser for generating a laserbeam, a beam splitter for splitting the laserbeam into at least two sub-laserbeams of largely of identical intensity;
    a workpiece support for holding workpiece; and
    a control unit for controlling the intensity of the laser and the movement of said workpiece support and the laserbeam with respect to each other,
    characterized in that said beamsplitter comprises a digital-phase grating for dividing the laserbeam coming from the laser into a plurality of sub-laserbeams to produce a projection pattern on the workpiece.

2. A device as claimed in claim 1, characterized in that said beamsplitter comprises a first movable grating disc having at least two digital-phase gratings said grating disc being insertable in the path of the laser beam under control of said control unit.

3. A device as claimed in claim 2, characterized in that said beamsplitter comprises a first movable grating disc comprising a further digital-phase grating, and means for moving said further digital-phase grating under control of said control unit into the path of the sub-laserbeams.

4. A device as claimed in claim 3 further comprising a diaphragm movable into the path of the sub-laserbeams.

5. A device as claimed in claim 4, further comprising a rotatable diaphragm disc comprising a plurality of different diaphragms and means for selectively rotating said different diaphragms into the path of said sub-laserbeams.

6. A device as claimed in claim 5, characterized in that an optical deflection unit is provided comprising an array of mirrors for deflecting the sub-laserbeams to the workpiece at an oblique angle relative to said workpiece support.

7. A device as claimed in claim 2, further comprising a diaphragm movable into the path of the sub-laserbeams.

8. A device as claimed in claim 1, further comprising a diaphragm movable into the path of the sub-laserbeams.

9. A device as claimed in claim 4, characterized in that an optical deflection unit is provided comprising an array of mirrors for deflecting the sub-laserbeams to the workpiece at an oblique angle relative to said workpiece support.

10. A device as claimed in claim 3, characterized in that an optical deflection unit is provided comprising an array of mirrors for deflecting the sub-laserbeams to the workpiece at an oblique angle relative to said workpiece support.

11. A device as claimed in claim 2, characterized in that an optical deflection unit is provided comprising an array of mirrors for deflecting the sub-laserbeams to the workpiece at an oblique angle relative to said workpiece support.

12. A device as claimed in claim 1, characterized in that an optical deflection unit is provided comprising an array of mirrors for deflecting the sub-laserbeams to the workpiece at an oblique angle relative to said workpiece support.

13. A device as claimed in claim 1, wherein said beamsplitter comprises a second digital phase grating in the path of the sub-laserbeams which further divides the sub-laserbeams.

14. A device as claimed in claim 13, wherein said second phase grating and said first phase grating are shifted, in parallel planes, relative to each other.

15. A device as claimed in claim 14, further comprising a diaphragm in the path of said sub-laserbeams.

16. A method device as recited in claim 15, characterized in that the beamsplitter comprises a second movable grating disc having at least one further digital-phase grating insertable, under control of the control unit, into the path of the sub-laserbeams.

* * * * *